US012713803B2

(12) United States Patent
Jung et al.

(10) Patent No.: US 12,713,803 B2
(45) Date of Patent: Aug. 18, 2026

(54) DISPLAY DEVICE

(71) Applicant: Samsung Display Co., Ltd., Yongin-si (KR)

(72) Inventors: Jiwon Jung, Yongin-si (KR); Guanghai Jin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 18/583,584

(22) Filed: Feb. 21, 2024

(65) Prior Publication Data

US 2024/0324381 A1 Sep. 26, 2024

(30) Foreign Application Priority Data

Mar. 24, 2023 (KR) ........................ 10-2023-0039121
Jun. 23, 2023 (KR) ........................ 10-2023-0081338

(51) Int. Cl.
*H10K 59/35* (2023.01)
*H10K 39/34* (2026.01)
*H10K 59/122* (2023.01)

(52) U.S. Cl.
CPC ........... *H10K 59/353* (2023.02); *H10K 39/34* (2023.02); *H10K 59/122* (2023.02)

(58) Field of Classification Search
CPC .... H10K 59/122; H10K 59/123; H10K 39/34; G06F 3/0412
See application file for complete search history.

(56) References Cited

U.S. PATENT DOCUMENTS

| | | | |
|---|---|---|---|
| 8,400,695 | B2 | 3/2013 | Kroll et al. |
| 10,147,777 | B2 | 12/2018 | Lim et al. |
| 11,551,639 | B2 | 1/2023 | Choi et al. |
| 2019/0164468 | A1 | 5/2019 | Jung |
| 2022/0416216 | A1 | 12/2022 | Woo et al. |

(Continued)

FOREIGN PATENT DOCUMENTS

| | | |
|---|---|---|
| KR | 10-2018-0018960 A | 2/2018 |
| KR | 10-2028997 B1 | 10/2019 |

(Continued)

OTHER PUBLICATIONS

Lee, G-Y. et al., "Metasurface eyepiece for augmented reality," Nature Communications, 2018, pp. 1-10.

(Continued)

*Primary Examiner* — John A Bodnar
(74) *Attorney, Agent, or Firm* — Womble Bond Dickinson (US) LLP

(57) ABSTRACT

A display device includes a substrate including a first display area, and a second display area surrounding at least a part of the first display area in plan view, a first pixel portion in the first display area, a first pixel circuit portion in the first display area, and electrically connected to the first pixel portion, a circuit-driving portion in the second display area, and configured to drive the first pixel circuit portion, a second pixel portion in the second display area to overlap the circuit-driving portion, a second pixel circuit portion in the second display area, and electrically connected to the second pixel portion, and a light-sensing region in the second display area to overlap an electronic component.

20 Claims, 9 Drawing Sheets

(56) References Cited

U.S. PATENT DOCUMENTS

2023/0363229 A1* 11/2023 Jo ........................ G09G 3/3233

FOREIGN PATENT DOCUMENTS

KR 10-2021-0097877 A 8/2021
KR 10-2023-0001578 A 1/2023

OTHER PUBLICATIONS

Wetzstein, G. et al., "Inference in artificial intelligence with deep optics and photonics," Nature, Dec. 3, 2020, vol. 588, pp. 39-47.
Joo, W-J., "Metasurface-driven OLED displays beyond 10,000 pixels per inch," Science 370, Oct. 23, 2020, pp. 459-464.
Kim, H. et al., "Actively variable-spectrum optoelectronics with black phosphorus," Nature, Aug. 12, 2021, vol. 596, pp. 232-252.
Internet:: "The next big thing in displays will come from thinking small," Raxium, dated 2021, 8 pages, https://www.raxium.com.
Choi, S. et al., "Time-multiplexed Neural Holography: A Flexible Framework for Holographic Near-eye-Displays with Fast Heavily-quantized Spatial Light Modulators," Siggraph '22 Conference Proceedings, Aug. 7-11, 2022, Vancouver, BC, Canada, 9 pages.
Kim, J. et al., "Holographic Glasses for Virtual Reality," Siggraph '22 Conference Proceedings, Aug. 7-11, 2022, Vancouver, BC, Canada, 9 pages.
Peng, Y. et al. "Speckle-free holography with partially coherent light sources and camera-in-the-loop calibration," Science Advances, Nov. 12, 2021, 7 pages.
Choi, S. et al., "Neural 3D Holography: Learning Accurate Wave Propagation Models for 3D Holographic Virtual and Augmented Reality Displays," ACM Transactions on Graphics, Dec. 2021, vol. 40, No. 6, Article 240, 12 pages.
Choi, S. et al., "Optimizing image quality for holographic near-eye displays with Michelson Holography," Optica, Feb. 2021, vol. 8, No. 2, pp. 143-146.
Gopakumar, M., "Unfiltered holography: optimizing high diffraction orders without optical filtering for compact holographic displays," Optics Letters, Dec. 1, 2021, vol. 46, No. 23, pp. 5822-5825.
Javidi, B. et al., "Roadmap on digital holography [Invited]," Optics Express, Oct. 12, 2021, vol. 29, No. 22, pp. 35078-35118.
Cakmakci, O. et al., "Holographic pancake optics for thin and lightweight optical see-through augmented reality," Optics Express, Oct. 13, 2021, vol. 29, No. 22, pp. 35206-35215.
Lindell, D. et al., "Three-dimensional imaging through scattering media based on confocal diffuse tomography," Nature Communications, Sep. 9, 2020, pp. 1-8.
Wetzstein, G. et al., "Optically sensing neural activity without imaging," Nature Photonics, Jun. 2020, vol. 14, pp. 340-341.
Chang, C. et al., "Toward the next-generation VR/AR optics: a review of holographic near-eye displays from a human-centric perspective," Optica, Nov. 2020, vol. 7, No. 11, pp. 1563-1578.
Javidi, B. et al., "Roadmap on 3D integral imaging: sensing, processing, and display," Optics Express, Oct. 12, 2020, vol. 28, No. 22, pp. 32266-32293.
Magnor, M. et al., "Real VR-Immersive Digital Reality," Lecture Notes in Computer Science, Springer, 2020, pp. 1-361.
Wetzstein, G., "Augmented and Virtual Reality," Nano-Chips 2030, 2020, Ch. 25, pp. 467-499.
Slinger, C. et al., "Computer-Generated Holography as a Generic Display Technology," Computer, Aug. 2005, IEEE Computer Society, pp. 46-53.
Kim, D. et al., "Accommodative holography: improving accommodation response for perceptually realistic holographic displays," ACM Transactions on Graphics, Jul. 2022, vol. 41, No. 4, Article 111, 15 pages.
Internet: "Peak signal-to-noise ratio," Wikipedia, https://en.wikipedia.org/wiki/Peak_signal-to-noise_ratio, 4 pages.

* cited by examiner

DISPLAY DEVICE

CROSS-REFERENCE TO RELATED APPLICATION

The present application claims priority to, and the benefit of, Korean Patent Application No. 10-2023-0039121, filed on Mar. 24, 2023, in the Korean Intellectual Property Office, and Korean Patent Application No. 10-2023-0081338, filed on Jun. 23, 2023, in the Korean Intellectual Property Office, the entire disclosures of which are incorporated herein by reference.

BACKGROUND

1. Field

One or more embodiments relate to a display device.

2. Description of the Related Art

Generally, a display device is operated by forming light-emitting elements, such as organic light-emitting diodes, and thin film transistors on a substrate, and allowing the light-emitting elements to emit light.

In detail, each pixel of a display device has a light-emitting element, such as an organic light-emitting diode, in which an intermediate layer including an emission layer is provided between a pixel electrode and a counter electrode. In a display device, whether to emit light or a degree of light emission of each pixel is generally controlled through thin film transistors electrically connected to pixel electrodes. Some layers included in the intermediate layer of the light-emitting element are provided in common to a plurality of light-emitting elements.

SUMMARY

One or more embodiments include a display device with improved resolution. However, such an aspect is merely an example, and the scope of the disclosure is not limited thereby.

Additional aspects will be set forth in part in the description that follows and, in part, will be apparent from the description, or may be learned by practice of the presented embodiments of the disclosure.

According to one or more embodiments, a display device includes a substrate including a first display area, and a second display area surrounding at least a part of the first display area in plan view, a first pixel portion in the first display area, a first pixel circuit portion in the first display area, and electrically connected to the first pixel portion, a circuit-driving portion in the second display area, and configured to drive the first pixel circuit portion, a second pixel portion in the second display area to overlap the circuit-driving portion, a second pixel circuit portion in the second display area, and electrically connected to the second pixel portion, and a light-sensing region in the second display area to overlap an electronic component.

A distance between adjacent second pixel portions in a first direction may be greater than a distance between adjacent first pixel portions in the first direction.

The light-sensing region may be arranged along a periphery of the first display area.

The first pixel portion may include a first pixel, a second pixel, and a third pixel that are configured to emit light of respective colors.

The second pixel portion may include a first pixel, a second pixel, and a third pixel that are configured to emit light of respective colors.

A sum of areas of emission areas of the second pixel portion may be less than a sum of areas of emission areas of the first pixel portion.

The sum of the areas of the emission areas of the first pixel portion may include a sum of areas of emission areas of the first pixel, the second pixel, and the third pixel included in the first pixel portion.

The display device may further include a pixel-defining layer above the substrate, and a light-emitting diode including a pixel electrode in a first opening defined in the pixel-defining layer, an intermediate layer above the pixel electrode, and a counter electrode, wherein the first pixel includes a light-emitting element, and wherein an area of an emission area of the first pixel is substantially equal to an area of the first opening defined in the pixel-defining layer.

The electronic component may be in a second opening defined in the pixel-defining layer, wherein the light-sensing region is substantially equal to an area of the second opening defined in the pixel-defining layer.

A number of the first pixel portions per unit area of the first display area may be substantially equal to a number of the second pixel portions per unit area of the second display area.

A number of light-sensing regions in the second display area may be substantially equal to a number of the second pixel portions in the second display area.

A number of the second pixel portions per unit area of the second display area may be less than a number of the first pixel portions per unit area of the first display area.

A sum of emission areas of the second pixel portions in the second display area may be substantially equal to a sum of emission areas of the first pixel portions in the first display area.

Only the light-sensing region might be in the second display area adjacent to sides extending in the first direction of sides of the first display area.

Only the light-sensing region might be in the second display area adjacent to sides extending in a second direction crossing the first direction of sides of the first display area.

The first pixel portion and the first pixel circuit portion may overlap each other.

The second pixel portion and the second pixel circuit portion might not overlap each other.

The circuit-driving portion may include a data-driving portion extending in the first direction for providing a data signal to the first and second pixel circuit portions.

The circuit-driving portion may include a scan-driving portion extending in a second direction crossing the first direction for providing a scan signal to the first and second pixel circuit portions.

The electronic component overlapping the light-sensing region may include a photodetector.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
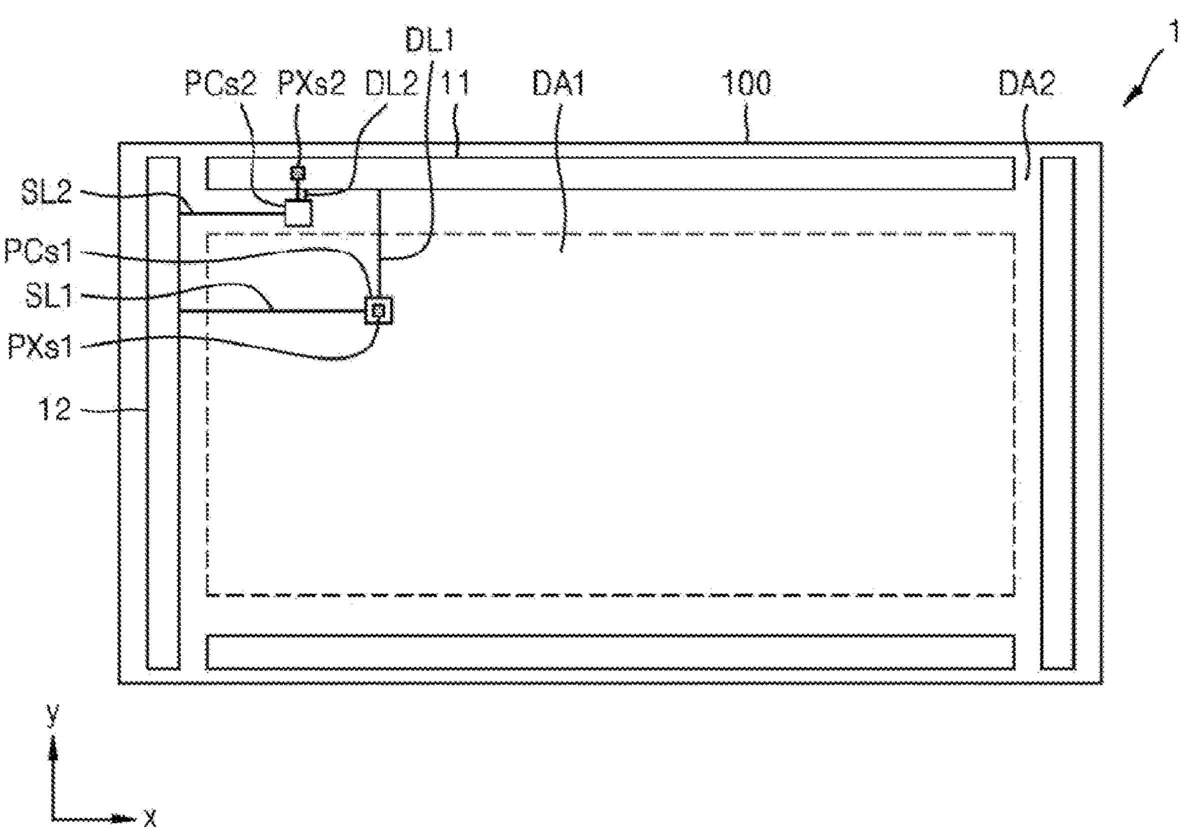
FIG. 1 is a schematic plan view of a display device according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The present disclosure covers all modifications, equivalents, and replacements within the idea and technical scope of the present disclosure. Further, each of the features of the various embodiments of the present disclosure may be combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display device 1 according to one or more embodiments. In detail, FIG. 1 schematically illustrates pixel portions and circuit-driving portions (e.g., a data-driving portion and a scan-driving portion) of the display device 1.

The display device 1 according to one or more embodiments, as a device for displaying a video or a still image, may be used as a display screen of not only portable electronic devices, such as mobile phones, smart phones, tablet personal computers (PCs), mobile communication terminals, electronic organizers, electronic books, portable multimedia players (PMPs), navigation devices, ultra mobile PCs (UMPCs), and the like, but also various products, such as televisions, notebook computers, monitors, billboards, internet of things (IoT), and the like. Furthermore, the display device 1 according to one or more embodiments may be used for wearable devices, such as smart watches, watch phones, glasses type displays, and head mounted displays (HMDs). Furthermore, the display device 1 according to one or more embodiments may be used as an instrument panel of a vehicle, a center information display (CID) arranged in the center fascia or dashboard of a vehicle, a room mirror display in lieu of a side mirror of a vehicle, or a display screen arranged at the rear surface of a front seat as an entertainment device for a rear seat of a vehicle.

The display device 1 may include a first display area DA1 and a second display area DA2. In other words, a substrate 100 that the display device 1 includes may include the first display area DA1 and the second display area DA2. The second display area DA2 may be arranged to surround at least a part of the first display area DA1. The first display area DA1 may be entirely surrounded by the second display area DA2. The first display area DA1 may have a rectangular shape. In detail, the length of the first display area DA1 extending in a first direction (e.g., x direction or −x direction) may be greater than the length of the first display area DA1 extending in a second direction (e.g., y direction or −y direction) crossing the first direction. However, the disclosure is not limited thereto. The first display area DA1 may have a circular, square, or oval shape, and the length of the first display area DA1 extending in the second direction (e.g., the y direction or the −y direction) may be greater than the length of the first display area DA1 extending in the first direction (e.g., the x direction or the −x direction).

In one or more embodiments, a first pixel portion PXs1 may be arranged in the first display area DA1, and a second pixel portion PXs2 may be arranged in the second display area DA2. A first pixel circuit portion PCs1 for driving the first pixel portion PXs1 in the first display area DA1 may be arranged in the first display area DA1. In detail, the first pixel circuit portion PCs1 may overlap the first pixel portion PXs1. A second pixel circuit portion PCs2 for driving the second pixel portion PXs2 in the second display area DA2 may be arranged in the display area DA2. In other words, the second pixel circuit portion PCs2 for driving the second pixel portion PXs2 may be arranged not to overlap the second pixel portion PXs2. However, the disclosure is not limited thereto.

Not only the second pixel portion PXs2 and the second pixel circuit portion PCs2, but also data-driving portion 11 and scan-driving portion 12 for driving the first pixel circuit portion PCs1 and the second pixel circuit portion PCs2 may be arranged in the second display area DA2. The data-driving portion 11 and scan-driving portion 12 may include a scan-driving portion 12 and a data-driving portion 11. The data-driving portion 11 may be arranged in the second display area DA2 to extend in the first direction (e.g., the x direction or the −x direction). The scan-driving portion 12 may be arranged in the second display area DA2 to extend in the second direction (e.g., the y direction or the −y direction).

The data-driving portion 11 may supply a data signal to the first pixel circuit portion PCs1 through a first data line DL1, and may supply a data signal to the second pixel circuit portion PCs2 through a second data line DL2. The scan-driving portion 12 may supply a scan signal to the first pixel circuit portion PCs1 through a first scan line SL1, and may supply a scan signal to the second pixel circuit portion PCs2 through a second scan line SL2.

In one or more embodiments, the first pixel portion PXs1 and the first pixel circuit portion PCs1, both arranged in the first display area DA1, may overlap each other. As the data-driving portion 11 and the scan-driving portion 12 are arranged in the second display area DA2, if the second pixel portion PXs2 is arranged to overlap the data-driving portion 11 and the scan-driving portion 12, the second pixel circuit portion PCs2 may be arranged not to overlap the second pixel portion PXs2. As the second pixel portions PXs2 are arranged even in the second display area DA2 in which the data-driving portion 11 and the scan-driving portion 12 are arranged, an area for displaying an image may be increased in the display device 1, and a resolution may be increased.

Figure 2:
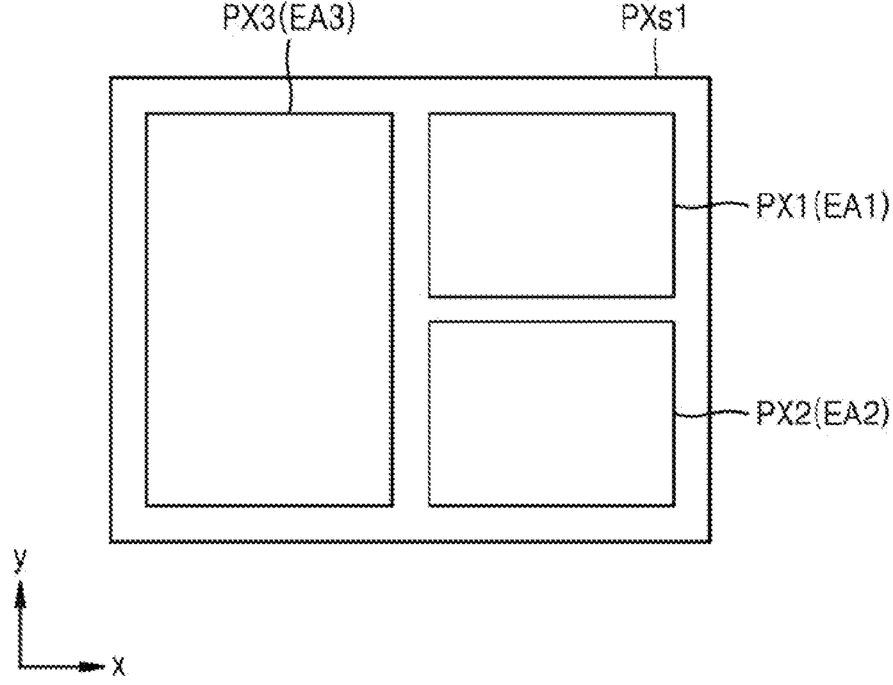
FIG. 2 is a schematic plan view of a first pixel portion.

FIG. 2 is a schematic plan view of the first pixel portion PXs1.

In one or more embodiments, the first pixel portion PXs1 may include a first pixel PX1, a second pixel PX2, and a third pixel PX3. The first pixel PX1 may emit light of a first color, the second pixel PX2 may emit light of a second color, and the third pixel PX3 may emit light of a third color. In detail, the light of a first color may be blue light, the light of a second color may be red light, and the light of third color may be green light.

The first pixel PX1 may be a first emission area EA1 from which the light of a first color is emitted, and the second pixel PX2 may be a second emission area EA2 from which the light of a second color is emitted. Furthermore, the third pixel PX3 may be a third emission area EA3 from which the light of a third color is emitted. The sum of the emission areas included in the first pixel portion PXs1 may be equivalent to the sum of an area of the first emission area EA1 of the first pixel PX1, the second emission area EA2 of the second pixel PX2, and the third emission area EA3 of the third pixel PX3.

Figure 8:
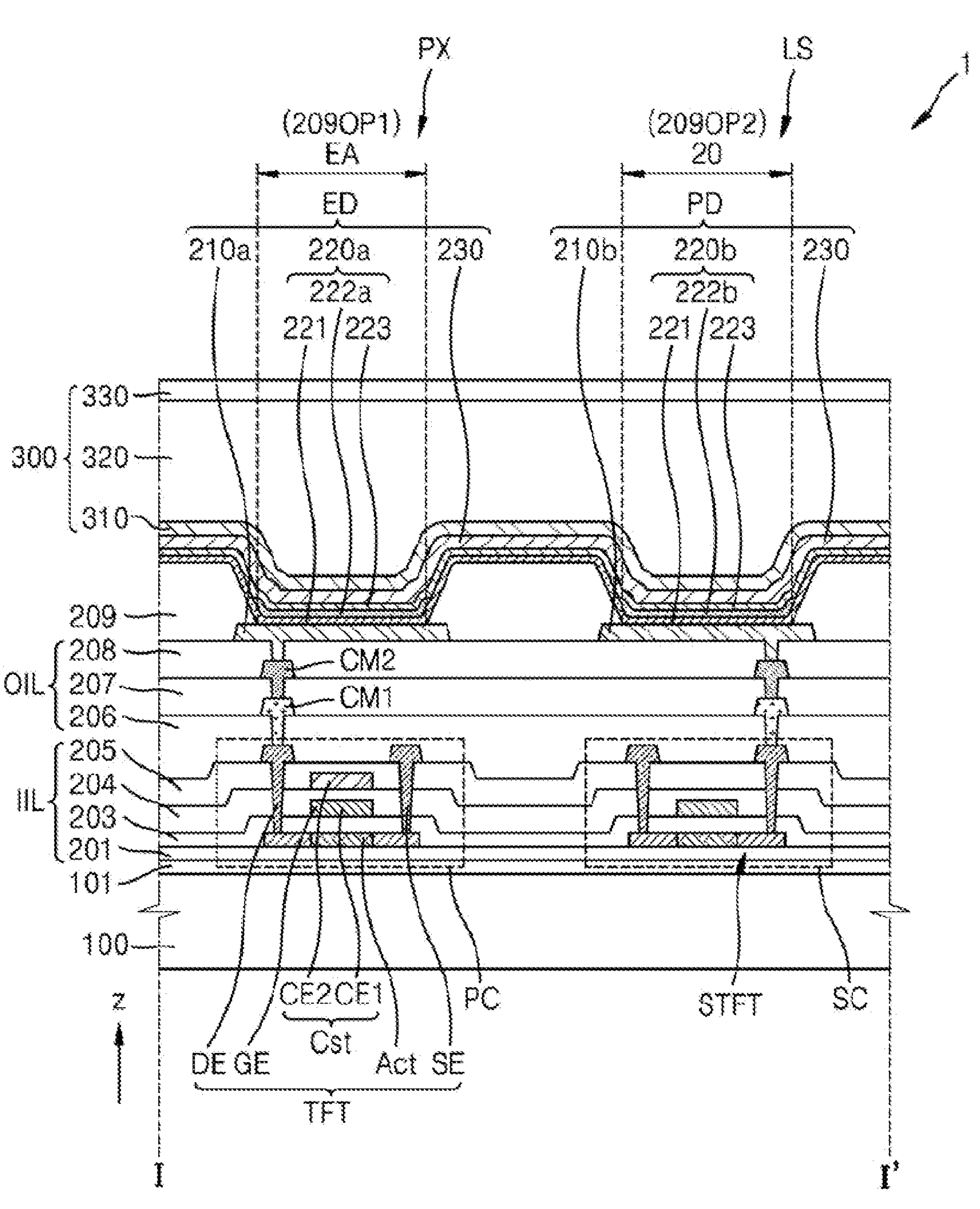
FIG. 8 is a schematic cross-sectional view of a display device according to one or more embodiments.

The first pixel PX1, the second pixel PX2, and the third pixel PX3 may each include a light-emitting diode ED (see FIG. 8). The light-emitting diode ED may include a pixel electrode 210*a* (see FIG. 8), a first intermediate layer 220*a* (see FIG. 8), and a counter electrode 230 (see FIG. 8). A pixel electrode 210*a* of the light-emitting diode ED may be arranged within a first opening 209OP1 (see FIG. 8) of a pixel-defining layer 209 (see FIG. 8) included in the display device 1, and the first intermediate layer 220*a* and the counter electrode 230 may be located on the pixel electrode 210*a*. The first emission area EA1, the second emission area EA2, and the third emission area EA3 may be an area where the light-emitting diode ED emits light, which may be the same as the area of the first opening 209OP1 of the pixel-defining layer 209.

In one or more embodiments, the second pixel portion PXs2, like the first pixel portion PXs1, may include the first pixel PX1, the second pixel PX2, and the third pixel PX3. The first pixel PX1 may emit light of a first color, the second pixel PX2 may emit light of a second color, and the third pixel PX3 may emit light of a third color. In detail, the light of a first color may be blue light, the light of a second color may be red light, and the light of a third color may be green light. The first pixel PX1 may be the first emission area EA1 from which the light of a first color is emitted, the second pixel PX2 may be the second emission area EA2 from which the light of a second color is emitted, and the third pixel PX3 may be the third emission area EA3 from which the light of a third color is emitted. The sum of the emission areas included in the second pixel portion PXs2 may be equivalent to the sum of the first emission area EA1 of the first pixel PX1, the second emission area EA2 of the second pixel PX2, and the third emission area EA3 of the third pixel PX3, which are included in the second pixel portion PXs2.

FIGS. 3 to 6 are schematic plan views of the display device 1 according to one or more embodiments.

Figure 3:
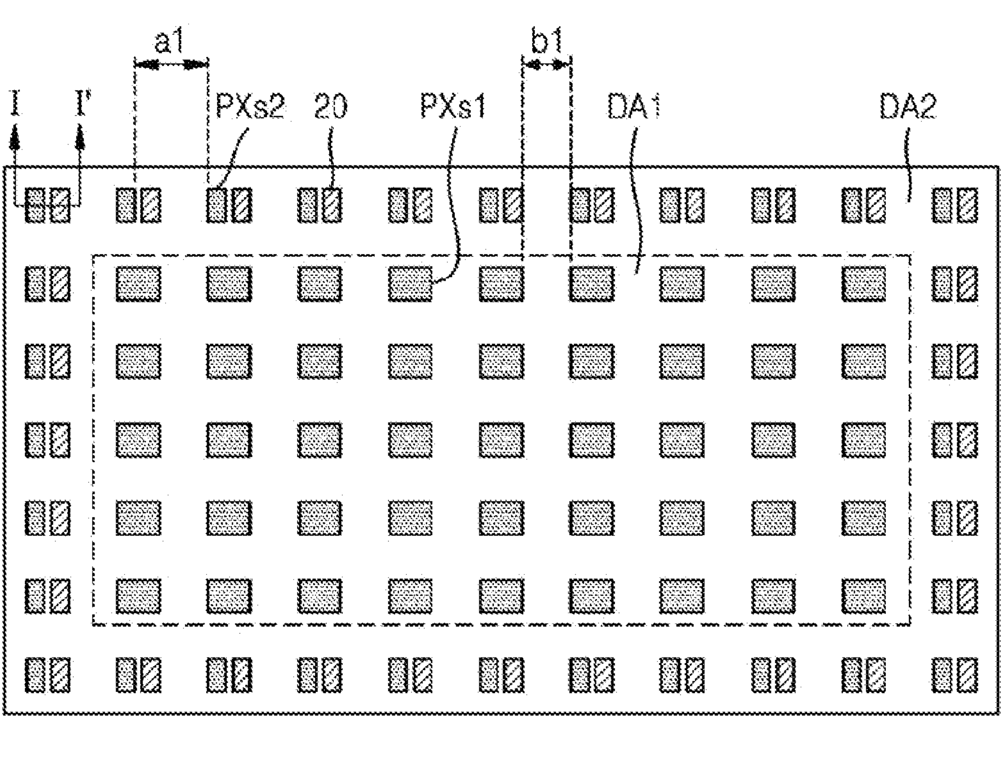
FIGS. 3 to 6 are schematic plan views of a display device according to one or more embodiments.
Figure 3:
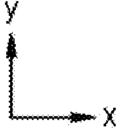

Referring to FIG. 3, as described above with reference to FIG. 1, the first pixel portion PXs1 may be arranged in the first display area DA1, and the second pixel portion PXs2 may be arranged in the second display area DA2. A light-sensing region 20 may be arranged in the second display area DA2. As a photodetector LS (e.g., an electronic component, see FIG. 7) is arranged below in the light-sensing region 20, the display device 1 may recognize a fingerprint, a blood pressure, an iris, and the like. As not only the light-sensing regions 20, but also the second pixel portions PXs2 are arranged in the second display area DA2, the resolution of the outside area of the display device 1 may be improved.

A distance a1 between the second pixel portions PXs2 neighboring in the first direction (e.g., the x direction or the −x direction) in the second display area DA2 may be greater than a distance b1 between the first pixel portions PXs1 neighboring in the first direction (e.g., the x direction or the −x direction) in the first display area DA1, due to not only the second pixel portions PXs2, but also the light-sensing regions 20, being arranged in the second display area DA2.

In one or more embodiments, the sum of the emission areas of the second pixel portion PXs2 may be less than the sum of the emission areas of the first pixel portion PXs1. The number of the first pixel portions PXs1 per unit area in the first display area DA1 may be the same as the number of the second pixel portions PXs2 per unit area in the second display area DA2.

The light-sensing regions 20 of the second display area DA2 may surround at least a part of the first display area DA1 (e.g., in plan view). In other words, the light-sensing regions 20 of the second display area DA2 may be arranged along the periphery of the first display area DA1.

The number of the light-sensing regions 20 arranged in the second display area DA2 may be the same as the number of the second pixel portions PXs2 arranged in the second display area DA2. In other words, one second pixel portion PXs2 and one light-sensing region 20 form a pair, and a plurality of pairs may be arranged in the second display area DA2 along the periphery of the first display area DA1. However, the disclosure is not limited thereto. In one or more embodiments, only the light-sensing regions 20 may be arranged in the second display area DA2 adjacent to sides extending in the first direction (e.g., the x direction or the −x direction) of the sides of the first display area DA1. Alternatively, only the light-sensing regions 20 may be arranged in the second display area DA2 adjacent to sides extending in the second direction (e.g., the y direction or the −y direction) of the sides of the first display area DA1.

Figure 4:
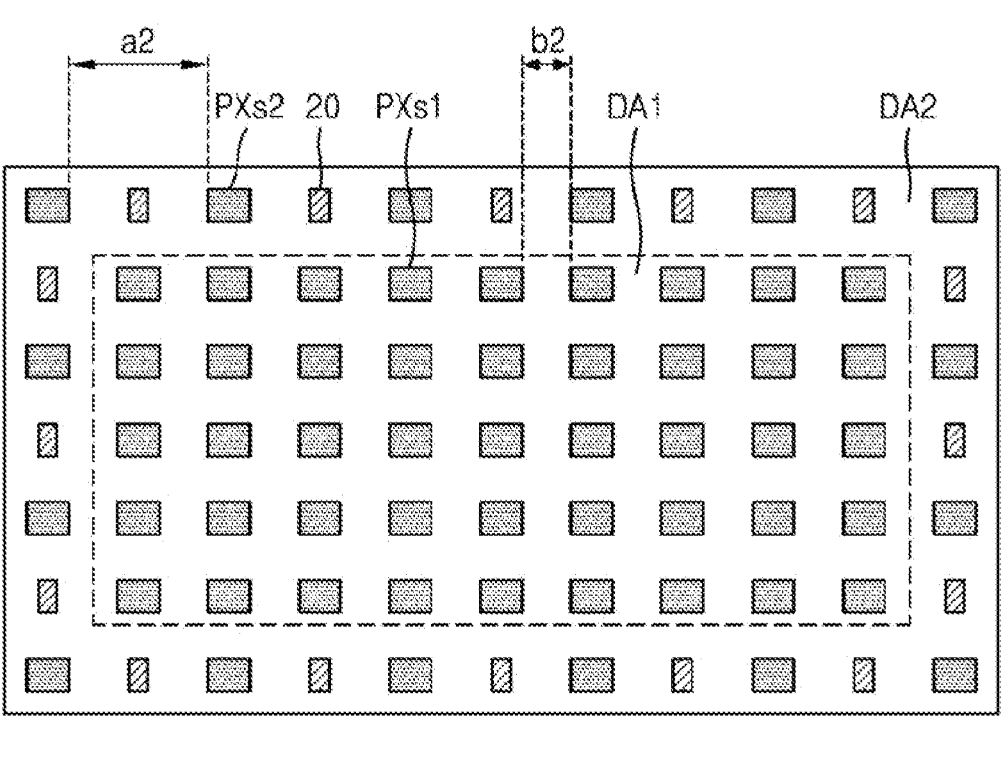
Figure 4:
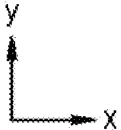

Referring to FIG. 4, a distance a2 between the second pixel portions PXs2 neighboring in the first direction (e.g., the x direction or the −x direction) in the second display area DA2 may be greater than a distance b2 between the first pixel portions PXs1 neighboring in the first direction (e.g., the x direction or the −x direction) in the first display area DA1, due to not only the second pixel portions PXs2, but also the light-sensing regions 20, being arranged in the second display area DA2.

In one or more embodiments, the sum of the emission areas of the first pixel portion PXs1 may be the same as the sum of the emission areas of the second pixel portion PXs2. The number of the first pixel portions PXs1 per unit area in the first display area DA1 may be different from the number of the second pixel portions PXs2 per unit area in the second display area DA2. In detail, the number of the second pixel portions PXs2 per unit area in the second display area DA2 may be less than the number of the first pixel portions PXs1 per unit area in the first display area DA1.

The light-sensing regions 20 of the second display area DA2 may surround at least a part of the first display area DA1 (e.g., in plan view). In other words, the light-sensing regions 20 of the second display area DA2 may be arranged along the periphery of the first display area DA1.

The number of the light-sensing regions 20 arranged in the second display area DA2 may be the same as the number of the second pixel portions PXs2 arranged in the second display area DA2. In other words, the light-sensing region 20 and the second pixel portion PXs2 may be alternately arranged in the second display area DA2. However, the disclosure is not limited thereto.

Figure 5:
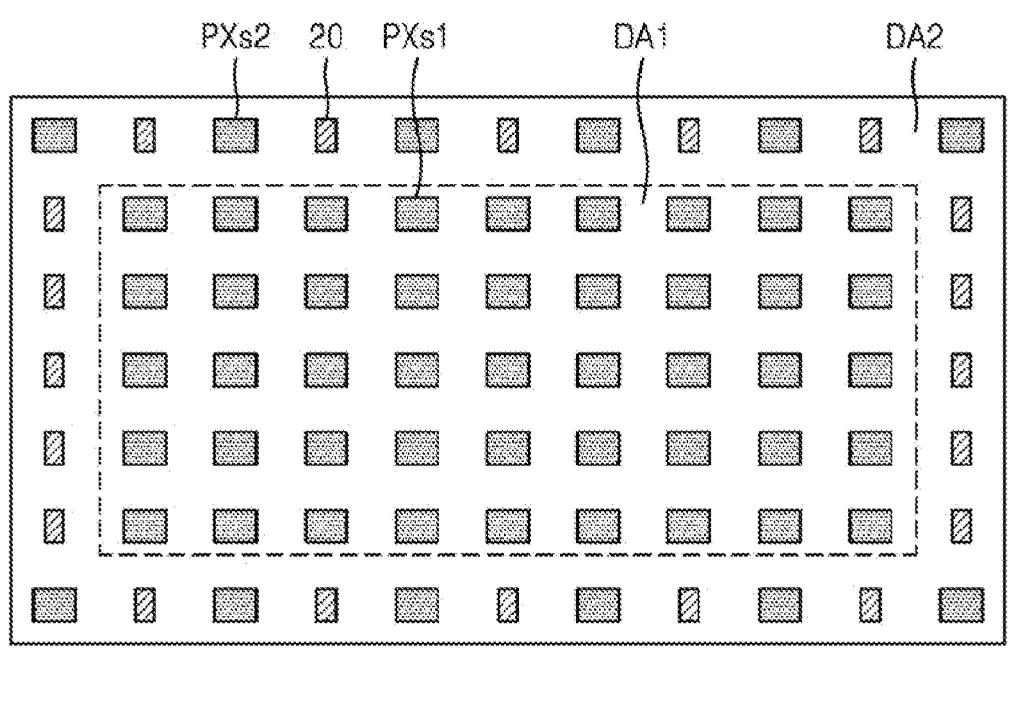
Figure 5:
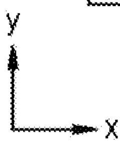
Figure 6:
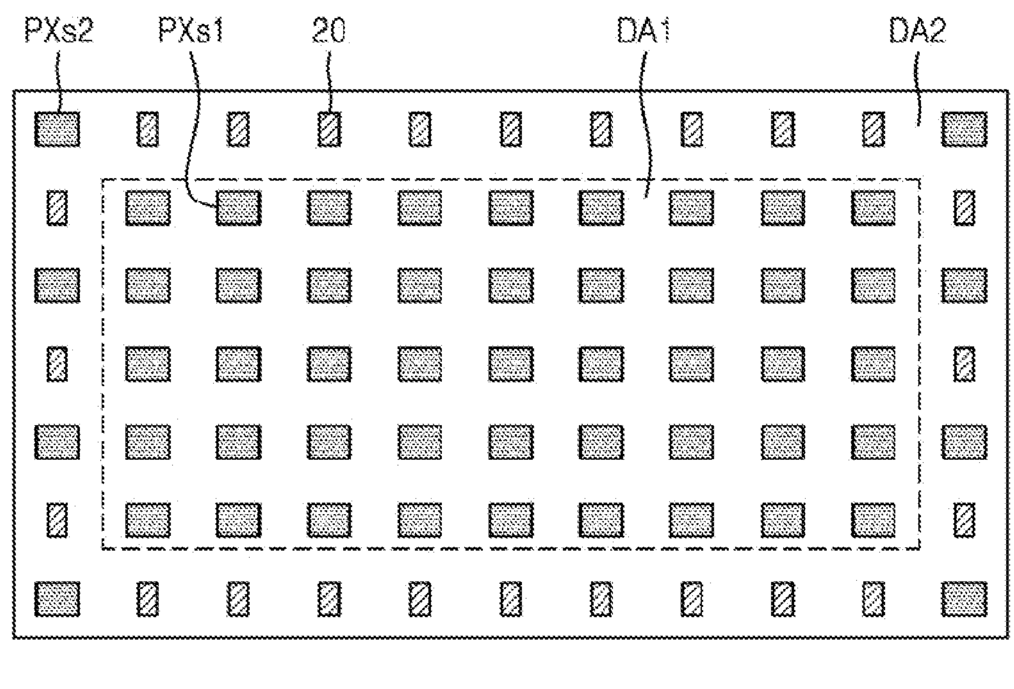

The number of the light-sensing regions 20 arranged in the second display area DA2 may be greater than the number of the second pixel portions PXs2 arranged in the second display area DA2. Referring to FIG. 5, the light-sensing regions 20 alone may be arranged in the second display area DA2 adjacent to sides extending in the first direction (e.g., the x direction or the −x direction) of the sides of the first display area DA1. Referring to FIG. 6, the light-sensing regions 20 alone may be arranged in the second display area DA2 adjacent to sides extending in the second direction (e.g., the y direction or the −y direction) of the sides of the first display area DA1.

Figure 7:
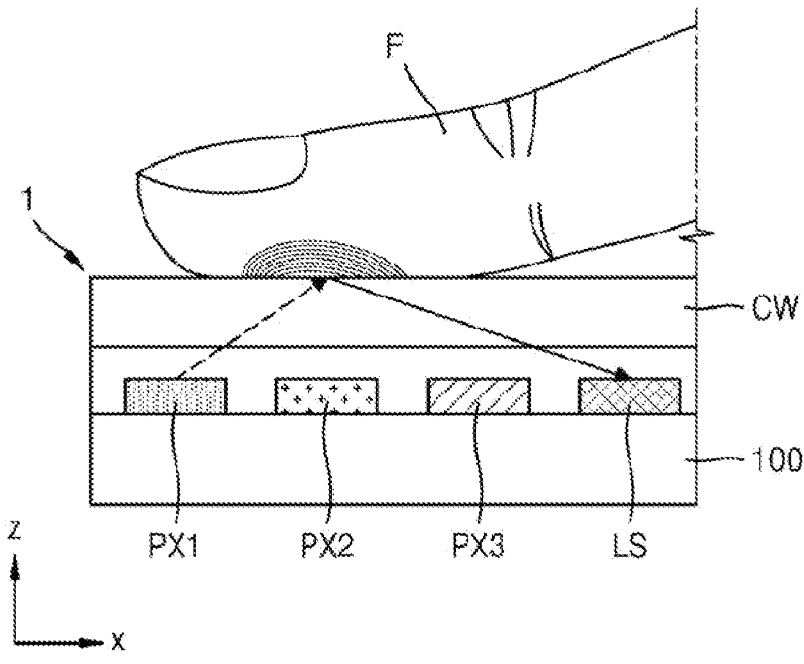
FIG. 7 is a schematic cross-sectional view of a display device according to one or more embodiments.

FIG. 7 is a schematic cross-sectional view of the display device 1 according to one or more embodiments.

Referring to FIG. 7, the display device 1 according to one or more embodiments may include the substrate 100, and the first pixel PX1, the second pixel PX2, the third pixel PX3, a photodetector LS, and a cover window CW, which are located on and above the substrate 100.

The first pixel PX1, the second pixel PX2, and the third pixel PX3 may each include a light-emitting diode and a pixel circuit connected to the light-emitting diode, and the photodetector LS may include a light-receiving diode and a sensor circuit connected to the light-receiving diode.

In one or more embodiments, the first pixel PX1, the second pixel PX2, and the third pixel PX3 may emit light of different respective colors. For example, the first pixel PX1 may emit light of a first color, the second pixel PX2 may emit light of a second color, and the third pixel PX3 may emit light of a third color. In this state, the light of a first color, the light of a second color, and the light of a third color may be red light, green light, and blue light, respectively, but the disclosure is not limited thereto.

The display device 1 may have a function of sensing an object in contact with the cover window CW, for example, a fingerprint of a finger F. In one or more embodiments, light emitted from at least one of the first pixel PX1, the second pixel PX2, and/or the third pixel PX3 may be reflected from the fingerprint of a user to re-enter the photodetector LS. The photodetector LS may detect reflected light to convert the detected reflected light into an electrical signal. For example, as the light of a first color emitted from the first pixel PX1 is reflected from the fingerprint of the finger F in contact with the cover window CW to re-enter the photodetector LS, the photodetector LS may obtain a fingerprint pattern of the finger F.

Although FIG. 7 illustrates an example of obtaining information of the object in contact with the display device 1 by using the reflection of the light emitted from the first pixel PX1, the disclosure is not limited thereto. The display device 1 may detect an object that is not in contact with the cover window CW of the display device 1.

FIG. 8 is a schematic cross-sectional view of the display device 1 according to one or more embodiments. In detail, FIG. 8 is a schematic cross-sectional view of the display device 1 of FIG. 3 taken along the line I-I'.

Referring to FIG. 8, a pixel PX and the photodetector LS may be located on the substrate 100. The pixel PX may include the light-emitting diode ED, and a pixel circuit PC electrically connected to the light-emitting diode ED. The photodetector LS may include a light-receiving diode PD, and a sensor circuit SC electrically connected to the light-receiving diode PD. The light-emitting diode ED, as a light-emitting element, may include an organic light-emitting diode, and the light-receiving diode PD, as a light receiving element, may include an organic photodiode.

A barrier layer 101 may be located on the substrate 100. The barrier layer 101 may include an inorganic insulating material, such as a silicon nitride, a silicon oxide, or a silicon oxynitride.

The buffer layer 201 may be located on the barrier layer 101. The barrier layer 101 and the buffer layer 201 may reduce or prevent infiltration of foreign materials, moisture, or external air from under the substrate 100, and may provide a planarized surface onto the substrate 100. The buffer layer 201 may include an inorganic material, an organic material, or an organic/inorganic complex, such as a silicon nitride, a silicon oxide, or a silicon oxynitride.

The pixel circuit PC and the sensor circuit SC may be located on the buffer layer 201. The pixel circuit PC may include a thin film transistor TFT and a storage capacitor Cst. The thin film transistor TFT may include a semiconductor layer Act, a gate electrode GE, a source electrode SE, and a drain electrode DE, and the storage capacitor Cst may include a first electrode CE1, which may be the same as the gate electrode, and a second electrode CE2.

The semiconductor layer Act may be located on the buffer layer 201. The semiconductor layer Act may include polysilicon. Alternatively, the semiconductor layer Act may include amorphous silicon, an oxide semiconductor, an organic semiconductor, and the like. The semiconductor layer Act may include a channel region, and a drain region and a source region arranged in respective sides of the channel region.

The gate electrode GE may be located on the semiconductor layer Act. The gate electrode GE may overlap the channel region of the semiconductor layer Act. The gate electrode GE may include a low resistance metal material. The gate electrode GE may include a conductive material including molybdenum (Mo), aluminum (Al), copper (Cu), titanium (Ti), and the like, and may be formed in a single layer or multilayer including the materials described above.

A first gate-insulating layer 203 may be arranged between the semiconductor layer Act and the gate electrode GE. The first gate-insulating layer 203 may include an inorganic insulating material, such as a silicon oxide, a silicon nitride, a silicon oxynitride, an aluminum oxide, a titanium oxide, a tantalum oxide, a hafnium oxide, a zinc oxide, or the like. The first gate-insulating layer 203 may be a single layer or multilayer including the inorganic insulating material described above.

A second gate-insulating layer 204 may be located on the gate electrode GE to cover the gate electrode GE. The second gate-insulating layer 204 may include an inorganic insulating material, such as a silicon oxide, a silicon nitride, a silicon oxynitride, an aluminum oxide, a titanium oxide, a tantalum oxide, a hafnium oxide, a zinc oxide, or the like. The second gate-insulating layer 204 may be a single layer or multilayer including the inorganic insulating material described above.

The second electrode CE2 of the storage capacitor Cst may be located on the second gate-insulating layer 204. At least a part of the second electrode CE2 may overlap the gate electrode GE. In this case, the gate electrode GE overlapping the second electrode CE2 of the storage capacitor Cst may function as the first electrode CE1 of the storage capacitor Cst. For example, the gate electrode GE may be integrally formed with the first electrode CE1.

The second electrode CE2 may include a conductive material including Mo, Al, Cu, Ti, and the like, and may be formed in a single layer or multilayer including the materials described above.

An interlayer insulating layer 205 may be located on the second electrode CE2. The interlayer insulating layer 205 may be formed to cover the second electrode CE2, and the interlayer insulating layer 205 may be a single layer or multilayer including the inorganic insulating material described above. An inorganic insulating layer IIL may include the buffer layer 201, the first gate-insulating layer 203, the second gate-insulating layer 204, and the interlayer insulating layer 205.

The source electrode SE and the drain electrode DE may be arranged on the interlayer insulating layer 205. The source electrode SE and the drain electrode DE may include a conductive material including Mo, Al, Cu, Ti, and the like, and in a multilayer or single layer including the materials described above. As an example, the source electrode SE and the drain electrode DE may each have a multilayer structure of Ti/Al/Ti. In some embodiments, the source electrode SE or the drain electrode DE may be omitted.

The sensor circuit SC may include a sensing thin film transistor STFT and the like. The sensing thin film transistor STFT included in the sensor circuit SC may have a structure similar to that of the thin film transistor TFT included in the pixel circuit PC.

Although FIG. 8 illustrates, for convenience of explanation, one thin film transistor TFT and one sensing thin film transistor STFT, the thin film transistor TFT and the sensing thin film transistor STFT may respectively include a plurality of thin film transistors TFT and a plurality of sensing thin film transistors STFT. In one or more embodiments, some of the thin film transistors TFTS and the sensing thin film transistors STFT may include silicon thin film transistors including silicon semiconductor layers, and the other may include oxide thin film transistors including oxide semiconductor layers. In this case, the inorganic insulating layer IIL may further include an oxide semiconductor layer between the second gate-insulating layer 204 and the interlayer insulating layer 205 and insulating layers to insulate a conductive layer located on the oxide semiconductor layer.

An organic insulating layer OIL may be provided to cover the pixel circuit PC and the sensor circuit SC. The organic insulating layer OIL may include a first planarization layer 206, a second planarization layer 207, and a third planarization layer 208, which are sequentially stacked in a thickness direction (z-axis direction).

The first planarization layer 206, the second planarization layer 207, and the third planarization layer 208 may provide a flat base surface to the pixel electrode 210*a* of the light-emitting diode ED and a sensing electrode 210*b* of the light-receiving diode PD, which are located thereabove.

The first planarization layer 206, the second planarization layer 207, and the third planarization layer 208 may each include a general purpose polymer, such as benzocyclobutene (BCB), polyimide, hexamethyldisiloxane (HMDSO), polymethylmethacrylate (PMMA), and/or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or the like. The first planarization layer 206, the second planarization layer 207, and the third planarization layer 208 may each be a single layer or multilayer including the organic insulating materials described above.

A first connection electrode CM1 may be arranged between the first planarization layer 206 and the second planarization layer 207, and a second connection electrode CM2 may be arranged between the second planarization layer 207 and the third planarization layer 208. The first connection electrode CM1 may be connected to the drain electrode DE of the thin film transistor TFT through a contact hole defined in the first planarization layer 206. The second connection electrode CM2 may be connected to the first connection electrode CM1 through a contact hole defined in the second planarization layer 207.

The first connection electrode CM1 and the second connection electrode CM2 may each include a conductive material including Mo, Al, Cu, Ti, and/or the like, and may be formed in a single layer or multilayer including the materials described above.

The light-emitting diode ED and the light-receiving diode PD may be located on the organic insulating layer OIL. The light-emitting diode ED may include the pixel electrode 210*a*, the counter electrode 230, and the first intermediate layer 220*a* arranged between the pixel electrode 210*a* and the counter electrode 230. The light-receiving diode PD may include the sensing electrode 210*b*, the counter electrode 230, and a second intermediate layer 220*b* arranged between the sensing electrode 210*b* and the counter electrode 230. The counter electrode 230 of the light-emitting diode ED and the counter electrode 230 of the light-receiving diode PD may be provided integrally.

The pixel electrode 210*a* and the sensing electrode 210*b* may be located on the third planarization layer 208 to be separated from each other. The pixel electrode 210*a* may be electrically connected to the thin film transistor TFT of the pixel circuit PC by the first connection electrode CM1 and the second connection electrode CM2.

The pixel electrode 210*a* may include a conductive oxide, such as an indium tin oxide (ITO), an indium zinc oxide (IZO), a zinc oxide (ZnO), an indium oxide ($In_2O_3$), an indium gallium oxide (IGO), or an aluminum zinc oxide (AZO). The pixel electrode 210*a* may include a reflective film including silver (Ag), magnesium (Mg), Al, platinum (Pt), palladium (Pd), gold (Au), nickel (Ni), neodymium (Nd), iridium (Ir), chromium (Cr), or a compound thereof. In one or more embodiments, the pixel electrode 210*a* may have a structure having films formed of ITO, IZO, ZnO, or $In_2O_3$ above/below the reflective film described above. The pixel electrode 210*a* may have a stack structure of ITO/Ag/ITO.

The sensing electrode 210*b* may be electrically connected to the sensing thin film transistor STFT of the sensor circuit SC by the connection electrodes. The sensing electrode 210*b* may have a structure that is the same as, or similar to, that of the pixel electrode 210*a*.

The pixel-defining layer 209 may be located on the third planarization layer 208 to cover edges of each of the pixel electrode 210*a* and the sensing electrode 210*b*. The pixel-defining layer 209 may define the first opening 209OP1 that exposes a central portion of the pixel electrode 210*a*, and may define a second opening 209OP2 that exposes a central portion of the sensing electrode 210*b*. The size and shape of an emission area EA of the light-emitting diode ED may be defined by the first opening 209OP1 that exposes the central portion of the pixel electrode 210*a*. The size and shape of the light-sensing region 20 of the light-receiving diode PD may be defined by the second opening 209OP2 that exposes the central portion of the sensing electrode 210*b*.

As the pixel-defining layer 209 increases each of a distance between the edge of the pixel electrode 210*a* and the counter electrode 230, and a distance between the edge of the sensing electrode 210*b* and the counter electrode 230, the likelihood of the generation of an arc and the like in the edge of the pixel electrode 210*a* and the edge of the sensing electrode 210*b* may be reduced or prevented. The pixel-defining layer 209 may include an organic insulating material, such as polyimide, polyamide, acryl resin, benzocyclobutene, HMDSO, phenol resin, and the like, and may be formed by a method, such as spin coating and the like.

The first intermediate layer 220*a* may be located on the pixel electrode 210*a*. The first intermediate layer 220*a* may include an emission layer 222*a* arranged corresponding to the pixel electrode 210*a*, and may include a first function layer 221 and a second function layer 223 located respectively below and/or above the emission layer 222*a*.

The second intermediate layer 220*b* may be located on the sensing electrode 210*b*. The second intermediate layer 220*b* may include an active layer 222*b* arranged corresponding to the sensing electrode 210*b*, and may include the first function layer 221 and the second function layer 223 respectively located below and/or above the active layer 222*b*. The first function layer 221 and the second function layer 223 may be common layers provided integrally over the light-emitting diode ED and the light-receiving diode PD.

The emission layer 222*a* may include an organic material including a fluorescent or phosphorescent material for emitting red, green, blue, or white light. The emission layer 222*a* may be an organic emission layer including a low molecular weight organic material or a polymer organic material. For example, the emission layer 222*a*, as an organic emission layer, may include copper phthalocyanine, tris-8-hydroxyquinoline aluminum, a poly-phenylenevinylene (PPV)-based material, or a polyfluorene-based material.

In one or more embodiments, the emission layer 222*a* may include a host material and a dopant material. The dopant material may include a light-emitting material, as a material for emitting light of a corresponding color. The light-emitting material may include at least one of a phosphorescent dopant, a fluorescent dopant, and/or quantum dots.

The active layer 222*b* may include a p-type organic semiconductor and an n-type organic semiconductor. In this state, the p-type organic semiconductor may operate as an electron doner, and the n-type organic semiconductor may operate as an electron acceptor.

In one or more embodiments, the active layer 222*b* may be a mixed layer in which the p-type organic semiconductor and the n-type organic semiconductor are mixed. In this case, the active layer 222*b* may be formed by co-depositing the p-type organic semiconductor and the n-type organic semiconductor. If the active layer 222*b* is a mixed layer, excitons may be generated within a diffusion length from a doner-acceptor interface.

In one or more embodiments, the p-type organic semiconductor may be compound that operates as an electron doner for supplying electrons. For example, the p-type organic semiconductor may include boron subphthalocyanine chloride (SubPc), copper(II)phthalocyanine (CuPc), tetraphenyldibenzoperiplantene (DBP), or any combination thereof, but the disclosure is not limited thereto.

In one or more embodiments, the n-type organic semiconductor may be a compound that operates as an electron acceptor for accommodating electrons. For example, the n-type organic semiconductor may include C60 fullerene, C70 fullerene, or any combination thereof, but the disclosure is not limited thereto.

In one or more embodiments, the first function layer 221 may include at least one of a hole injection layer, a hole transport layer, and/or an electron-blocking layer. The first function layer 221 may have a single layer structure or a multilayer structure. If the first function layer 221 has a multilayer structure, the first function layer 221 may include a hole injection layer and a hole transport layer, a hole injection layer and an electron-blocking layer, a hole transport layer and an electron-blocking layer, or a hole injection layer, a hole transport layer, and an electron-blocking layer, which are sequentially stacked in the thickness direction (the z-axis direction). However, the disclosure is not limited thereto.

In one or more embodiments, the second function layer 223 may include at least one of an electron injection layer, an electron transport layer, and/or a hole-blocking layer. The second function layer 223 may have a single layer structure or a multilayer structure. If the second function layer 223 has a multilayer structure, the second function layer 223 may include an electron transport layer and an electron injection layer, a hole-blocking layer and an electron injection layer, a hole-blocking layer and an electron transport layer, or a hole-blocking layer, an electron transport layer, and an electron injection layer, which are sequentially stacked in the thickness direction (the z-axis direction). However, the disclosure is not limited thereto.

The counter electrode 230 may be located on the first intermediate layer 220*a* and the second intermediate layer 220*b*. The counter electrode 230 may include a conductive material having a relatively low work function. For example, the counter electrode 230 may include a (semi-)transparent layer including Ag, Mg, Al, Ni, Cr, lithium (Li), calcium (Ca), an alloy thereof, or the like. Alternatively, the counter electrode 230 may further include a layer including ITO, IZO, ZnO, or $In_2O_3$ on the (semi-)transparent layer including the material described above. In one or more embodiments, the counter electrode 230 may include Ag and Mg. The counter electrode 230 may be integrally provided over the entire surfaces of the first display area DA1 and the second display area DA2. For example, the counter electrode 230 of the light-emitting diode ED and the counter electrode 230 of the light-receiving diode PD may be integrally provided.

An encapsulation layer 300 may be located on the counter electrode 230 to cover the light-emitting diode ED and the light-receiving diode PD. In one or more embodiments, the encapsulation layer 300 may include at least one inorganic encapsulation layer and at least one organic encapsulation layer. For example, the encapsulation layer 300 may include first and second inorganic encapsulation layers 310 and 330 and an organic encapsulation layer 320 arranged therebetween.

The first and second inorganic encapsulation layers 310 and 330 may each include one or more inorganic insulating materials. The inorganic insulating material may include a silicon oxide, a silicon nitride, or a silicon oxynitride. The first and second inorganic encapsulation layers 310 and 330 may be formed through a chemical vapor deposition method.

The organic encapsulation layer 320 may further include polyethylene terephthalate, polyethylene naphthalate, polycarbonate, polyimide, polyethylene sulfonate, polyoxymethylene, polyarylate, HMDSO, acrylic resin, or a combination thereof. The organic encapsulation layer 320 may provide a flat upper surface. Accordingly, even if an input sensing layer and the like is formed on the encapsulation layer 300 by a continuous process, a defect rate may be reduced.

The encapsulation layer 300 may entirely cover the first display area DA1 and may extend to the second display area DA2 to cover at least a part of the second display area DA2.

Figure 9:
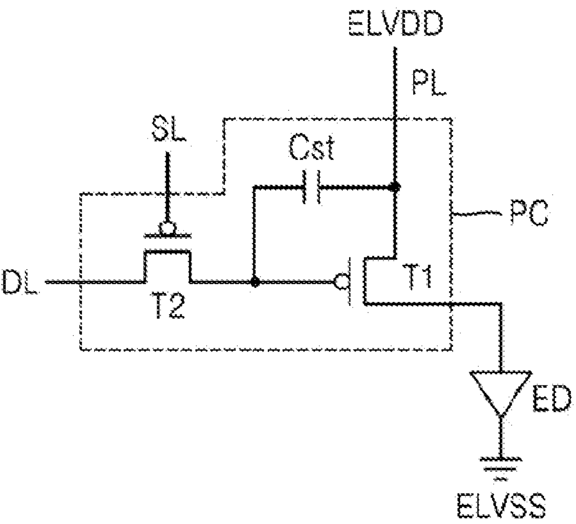
FIG. 9 is an equivalent circuit diagram of a pixel circuit electrically connected to a light-emitting diode in a pixel.

FIG. 9 is an equivalent circuit diagram of the pixel circuit PC electrically connected to the light-emitting diode ED in a pixel.

Referring to FIG. 9, the pixel circuit PC may include a first transistor T1, a second transistor T2, and the storage capacitor Cst. The second transistor T2, as a switching transistor, may be connected to a scan line SL and a data line DL and may be turned on in response to a switching signal output from the scan line SL to transmit a data signal input through the data line DL to the first transistor T1. The storage capacitor Cst may have one end electrically connected to the second transistor T2 and the other end electrically connected to a driving voltage line PL, and may store a voltage corresponding to a difference between the voltage received from the second transistor T2 and a driving power voltage ELVDD supplied through the driving voltage line PL.

The first transistor T1, as a driving transistor, may be connected to the driving voltage line PL and the storage capacitor Cst and may control, in response to a voltage value stored in the storage capacitor Cst, the magnitude of a driving current flowing from the driving voltage line PL to the light-emitting diode ED. The light-emitting diode ED may emit light having a certain luminance by the driving current. The counter electrode 230 of the light-emitting diode ED may receive an electrode power voltage ELVSS.

Although FIG. 9 illustrates that the pixel circuit PC includes two transistors and one storage capacitor, the disclosure is not limited thereto. For example, the number of transistors or the number of storage capacitors may vary depending on the design of the pixel circuit PC.

According to one or more embodiments, as the second pixel portion PXs2 may be arranged not only in the first display area DA1, but also in the second display area DA2 in which the data-driving portion 11 and scan-driving portion 12 and the light-sensing regions 20 are arranged, the resolution of the outside area/outer area of the display device 1 may be improved.

According to one or more embodiments described above, a display device with improved resolution and visibility may be implemented. The scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display device comprising:

a substrate comprising a first display area, and a second display area surrounding at least a part of the first display area in plan view;

a first pixel portion in the first display area;

a first pixel circuit portion in the first display area, and electrically connected to the first pixel portion;

a circuit-driving portion in the second display area, and configured to drive the first pixel circuit portion;

a second pixel portion in the second display area to overlap the circuit-driving portion;

a second pixel circuit portion in the second display area, and electrically connected to the second pixel portion; and a light-sensing region in the second display area to overlap an electronic component.

2. The display device of claim 1, wherein a distance between adjacent second pixel portions in a first direction is greater than a distance between adjacent first pixel portions in the first direction.

3. The display device of claim 1, wherein the light-sensing region is arranged along a periphery of the first display area.

4. The display device of claim 1, wherein the first pixel portion comprises a first pixel, a second pixel, and a third pixel that are configured to emit light of respective colors.

5. The display device of claim 1, wherein the second pixel portion comprises a first pixel, a second pixel, and a third pixel that are configured to emit light of respective colors.

6. The display device of claim 4, wherein a sum of areas of emission areas of the second pixel portion is less than a sum of areas of emission areas of the first pixel portion.

7. The display device of claim 6, wherein the sum of the areas of the emission areas of the first pixel portion comprises a sum of areas of emission areas of the first pixel, the second pixel, and the third pixel included in the first pixel portion.

8. The display device of claim 7, further comprising:

a pixel-defining layer above the substrate; and a light-emitting diode comprising a pixel electrode in a first opening defined in the pixel-defining layer, an intermediate layer above the pixel electrode, and a counter electrode, wherein the first pixel comprises a light-emitting element, and wherein an area of an emission area of the first pixel is substantially equal to an area of the first opening defined in the pixel-defining layer.

9. The display device of claim 8, wherein the electronic component is in a second opening defined in the pixel-defining layer, and wherein the light-sensing region is substantially equal to an area of the second opening defined in the pixel-defining layer.

10. The display device of claim 2, wherein a number of the first pixel portions per unit area of the first display area is substantially equal to a number of the second pixel portions per unit area of the second display area.

11. The display device of claim 2, wherein a number of light-sensing regions in the second display area is substantially equal to a number of the second pixel portions in the second display area.

12. The display device of claim 2, wherein a number of the second pixel portions per unit area of the second display area is less than a number of the first pixel portions per unit area of the first display area.

13. The display device of claim 2, wherein a sum of emission areas of the second pixel portions in the second display area is substantially equal to a sum of emission areas of the first pixel portions in the first display area.

14. The display device of claim 2, wherein only the light-sensing region is in the second display area adjacent to sides extending in the first direction of sides of the first display area.

15. The display device of claim 2, wherein only the light-sensing region is in the second display area adjacent to sides extending in a second direction crossing the first direction of sides of the first display area.

16. The display device of claim 1, wherein the first pixel portion and the first pixel circuit portion overlap each other.

17. The display device of claim 1, wherein the second pixel portion and the second pixel circuit portion do not overlap each other.

18. The display device of claim 2, wherein the circuit-driving portion comprises a data-driving portion extending in the first direction for providing a data signal to the first and second pixel circuit portions.

19. The display device of claim 18, wherein the circuit-driving portion comprises a scan-driving portion extending in a second direction crossing the first direction for providing a scan signal to the first and second pixel circuit portions.

20. The display device of claim 1, wherein the electronic component overlapping the light-sensing region comprises a photodetector.

* * * * *